United States Patent [19]
Rozental et al.

[11] Patent Number: 5,748,037
[45] Date of Patent: May 5, 1998

[54] RADIO TRANSMITTER POWER AMPLIFIER CALIBRATION

[75] Inventors: Mark Rozental, Rehovot; Ilan Yehezkel Horowitz, Nes-Ziona; Moshe Ben-Ayun, Holon, all of Israel

[73] Assignee: Motorola, Inc., Schaumburg, Ill.

[21] Appl. No.: 722,120

[22] PCT Filed: Mar. 8, 1995

[86] PCT No.: PCT/IB95/00144

§ 371 Date: Dec. 2, 1996

§ 102(e) Date: Dec. 2, 1996

[87] PCT Pub. No.: WO95/24766

PCT Pub. Date: Sep. 14, 1995

[30] Foreign Application Priority Data

Mar. 11, 1994 [GB] United Kingdom ............... 9404665

[51] Int. Cl.[6] .................................................. H03F 1/26
[52] U.S. Cl. ........................... 330/2; 455/115; 330/149
[58] Field of Search .............................. 330/2, 129, 149; 455/115, 126

[56] References Cited

U.S. PATENT DOCUMENTS

| | | | |
|---|---|---|---|
| 5,041,793 | 8/1991 | Gailus | 330/2 |
| 5,066,923 | 11/1991 | Gailus et al. | 330/107 |
| 5,239,693 | 8/1993 | Gailus et al. | 455/115 |
| 5,564,087 | 10/1996 | Cygan et al. | 455/115 X |
| 5,574,992 | 11/1996 | Cygan et al. | 330/149 X |

FOREIGN PATENT DOCUMENTS 2265269  9/1993  United Kingdom.

*Primary Examiner*—Steven Mottola
*Attorney, Agent, or Firm*—Frank M. Scutch, III

[57] ABSTRACT

A method of calibration of a power amplifier for a radio transmitter is described (FIG. 6), which is particularly relevant to the field of training of linear power amplifiers. In a calibration mode, an increasing signal, e.g. a ramp signal (153), is provided to the amplifier until the amplifier commences clipping (155). A value for said input is identified (155) which does not cause clipping. Thereafter, in operational mode, the increasing input signal is limited to that level. In this manner, interference during training is avoided. A radio transmitter is also provided.

10 Claims, 6 Drawing Sheets

RADIO TRANSMITTER POWER AMPLIFIER CALIBRATION

FIELD OF THE INVENTION

This invention relates to a method of calibration of a power amplifier for a radio transmitter, and is particularly relevant to the field of training of linear power amplifiers.

BACKGROUND OF THE INVENTION

A typical linear transmitter uses a class AB power amplifier (PA) with a negative feedback technique, such as Cartesian feedback, to achieve high linearity and prevent adjacent channel interference. The Cartesian feedback loop is a closed loop that includes a non linear RF (radio frequency) PA. The PA's linearity performance improves in proportion to the loop gain when it is closed in the loop.

U.S. Pat. No. 5,066,923 of Motorola describes a method of training a power amplifier for, among other advantages, improved efficiency.

There are a number of disadvantages with known linear transmitters. In particular, training of the amplifier allows the PA to operate in its non-linear region for a short time when "clipping" of the PA occurs. During this time there is an increase in interference in the adjacent channel. Moreover, this occurs at the amplifier's maximum power. Allowing the amplifier to output more power than necessary causes damage and decrease the mean time between failures.

SUMMARY OF THE INVENTION

According to the present invention, a method of calibrating a power amplifier for a radio transmitter is provided, comprising the steps of: entering a calibration mode of operation; providing an increasing input signal to the amplifier until the amplifier commences clipping; reducing the maximum input level of said input signal and identifying a value for said input which does not cause clipping; entering an operational mode; periodically providing an increasing input signal to the amplifier up to said value and determining whether clipping occurs.

In this manner, the maximum limit of training is set in the calibration mode. The maximum limit is set at a level known to be below the clip point. Thereafter, training signals are not allowed to exceed that level.

In a preferred embodiment, the maximum level is set at 0.4 dB below the clip point. This represents negligible reduction in efficiency. The margin at which the maximum level is set below the clip point can have other values. It is preferred that the margin is in the range of about 1.5 dB to about 0.4 dB. Any greater margin would sacrifice efficiency and any lower margin would increase the risk of clipping and interference.

Various steps can be taken as described below and as claimed, to (a) check that clipping is not occurring or about to occur and (b) to avoid further clipping in the event that clipping occurs.

According to another aspect of the invention, a radio transmitter comprising a power amplifier having an input and an output, controlled input signal generating means for supplying a signal to the input, output monitoring means for determining when the amplifier commences clipping, memory means for storing a maximum input signal value and control means arranged to provide an input signal to the amplifier, wherein the control means are arranged to store in said memory means a maximum input signal value and to control the input signal generating means to generate periodically an increasing input signal up to a value not exceeding said stored value. The stored value represents an input signal value below a value at which clipping will commence.

Preferred embodiments of the invention are now described, by way of example only, with reference to the drawings.

DETAILED DESCRIPTION OF THE DRAWINGS AND THE PREFERRED EMBODIMENT

Figure 1:
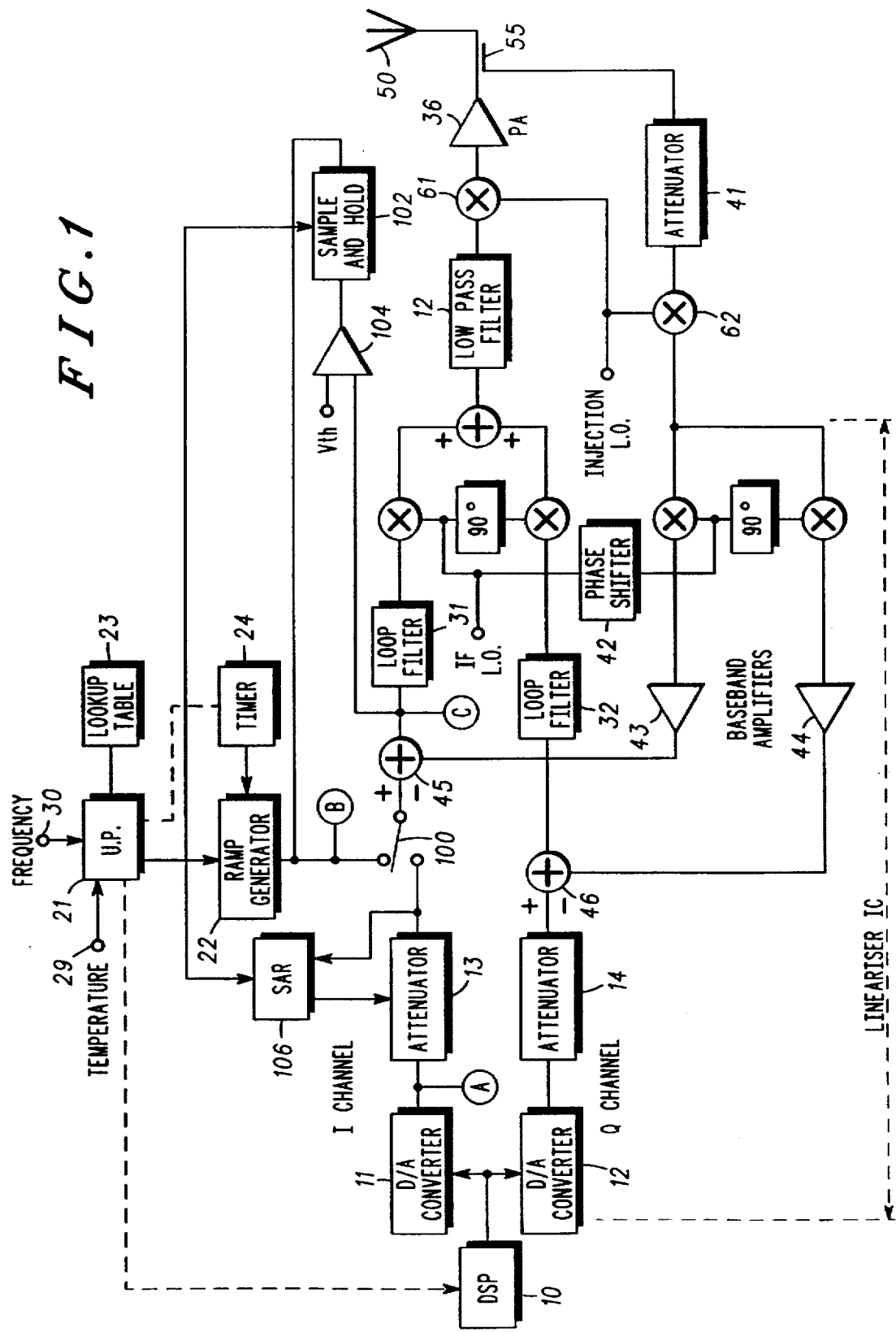
FIG. 1 shows a radio transmitter circuit with a power amplifier.

FIG. 1 describes an example of a radio transmitter with a Cartesian feedback loop representative of existing training techniques, similar to that described in U.K. patent application No. 9317316.9, filed on 20 Aug. 1993 and now implemented in digital private mobile radios of Motorola, Inc.

The radio transmitter comprises a DSP (digital signal processor) 10, a D/A (digital to analog converter) for I channel 11, a D/A for Q channel 12, input attenuation for I channel 13, input attenuation for Q channel 14, a loop filter for I channel 31, a loop filter for Q channel 32, a low pass filter 35, an up-converter 61, a power amplifier 36 and an antenna 50. The power amplifier 36 output signal is sampled by a coupler 55 and attenuated by a feedback attenuator 41. The feedback attenuator 41 is connected to a down-converter 62 and splits into I and Q channels and the signal goes to the baseband amplifier for the I channel 43 and to the baseband amplifier for the Q channel 44, closing the loop. The loop has also a microprocessor 21 which senses the temperature via line 29 and updates transmission parameters from look up table 23. Among other functions, the microprocessor 21 controls a ramp generator 22 and a timer 24.

A software switch 100 selectively connects the attenuator 13 or the ramp generator 22 to the summer 45, under control of the microprocessor 21.

The circuit has a sample-and-hold (S/H) circuit 102 receiving a control signal from a comparator 104 having first inputs connected to the output of the summer 45 and a second input connected to a threshold voltage $V_{th}$. The signal to be sampled and held comes from the ramp generator 22. The sample-and-hold circuit 102 provides an output to the ramp generator 22 and to a successive approximation register (SAR) 106.

In order to maintain the required linearity and good efficiency it is necessary to tune the drive level of the PA 36 to be below clip. The method that is used is a training ramp at the baseband input that increases the input until clip is detected by comparing the loop error to a level that indicates clip. The ramp's input level is sampled at the time that clip is detected and the data input level is adjusted to be below clip.

At the beginning of the output level training, the software switch 100 is opened and the ramp generator 22 starts the ramp. At the same time DSP 10 outputs a signal that corresponds to the maximum output signal from the DSP. $V_{error}$ is compared with $V_{threshold}$ by the comparator 104. When the clip occurs ($V_{error}$ is higher or equal then $V_{threshold}$), the analog ramp is sampled and held by sample-and-hold circuit 102. Using the successive approximation register 106, the sampled value is compared with the DSP signal and the variable attenuators 13 & 14 are set so that the level of the signal from the attenuators 13, 14 is equal to the level of the ramp.

Figure 2:
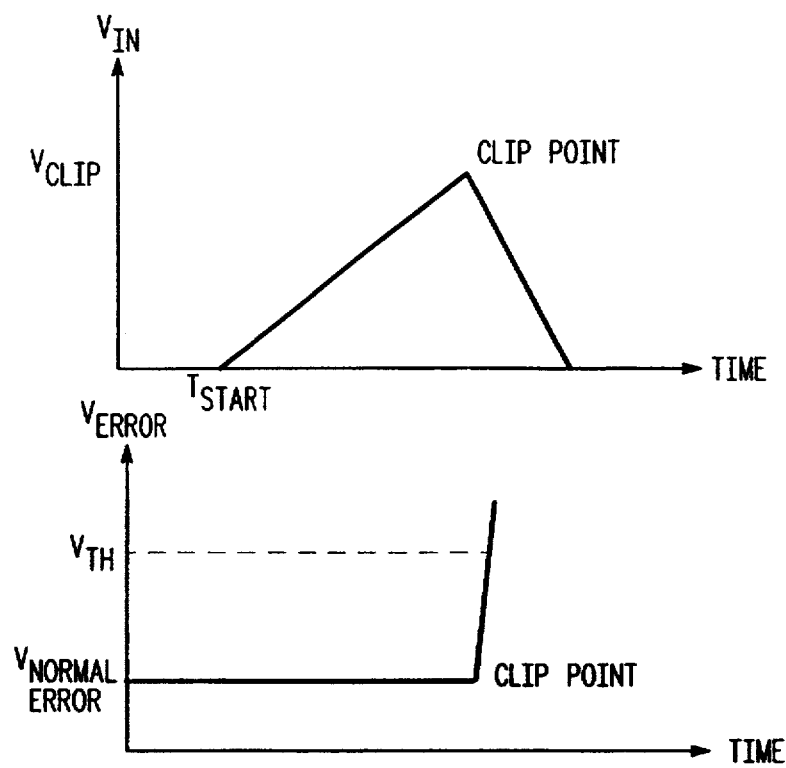
FIG. 2 shows diagrams of various signals in the circuit of FIG. 1 on a time axis during training of the amplifier of FIG. 1.

FIG. 2 describes a training ramp signal and corresponding loop error signal. The upper drawing represents the output of the analog ramp generator 22 and the lower drawing shows the corresponding loop error voltage at point C (FIG. 1). The ramp signal is applied from analog ramp generator 22 at point B (after attenuator 13, before the summer 45). The slope and duration of the ramp are selected so that the clip will occur.

Before the clip occurs, the loop error voltage is some small constant value $V_{norm\_error}$. When the clip occurs, the loop error voltage rises very substantially until it reaches a threshold $V_{th}$ and the clip is detected. At this point, the voltage of the analog ramp is sampled and held. At the same time, the DSP outputs a constant signal. The signal from the DSP is compared with the sampled value of the analog ramp and, using a successive approximation algorithm, the variable attenuator 13, 14 is set to a value at which the DSP signal is equal to the held ramp signal. After the clip is detected and the ramp value is sampled and held, the ramp is disabled.

Figure 3:
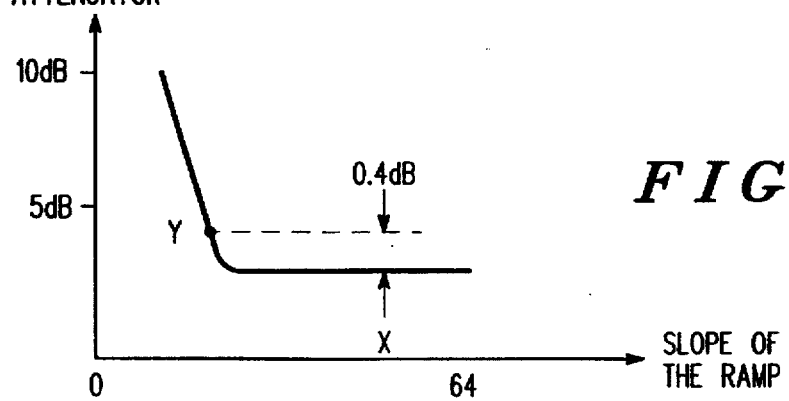
FIGS. 3 and 4 show attenuator level and output power level respectively for the circuit of FIG. 1, with dotted lines representing modified operation in accordance with the preferred embodiments of the invention.

FIG. 3 shows a graph of variable attenuator (13, 14) attenuation as a function of the slope of the analog ramp. For the high slope (clip occurring) there is a constant value of the attenuator. When the slope becomes smaller, the attenuation rises.

Figure 4:
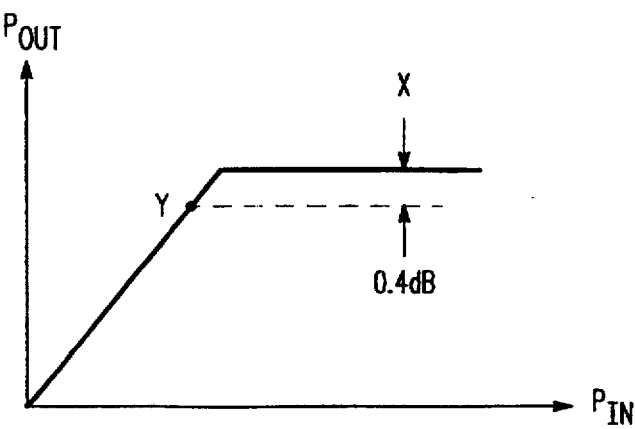

FIG. 4 shows power in ($P_{in}$) to power out ($P_{out}$) characteristics of the power amplifier 36.

There are three major disadvantages with the above described arrangement: (a) clipping the PA cause 20 dB interference increase in the adjacent channel during the clip; (b) during the training slot, the radio can output more then 3.4 Watt; and (c) driving the PA to the clip can cause the PA to output more power then necessary, thus causing damage to the PA and decreasing its mean time between failures.

Figure 5:
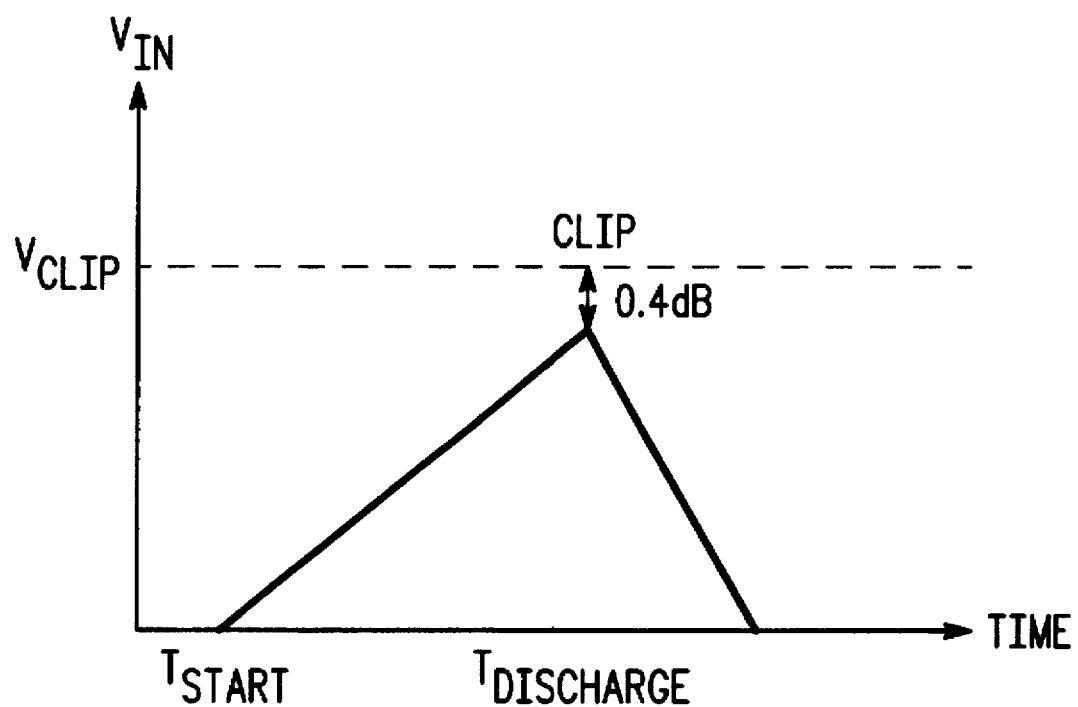
FIG. 5 is a diagram of input voltage on a time axis during training in accordance with the preferred embodiments of the invention.

In accordance with the preferred embodiment of the invention, a ramp calibration and power normalization concept is used to reduce adjacent cannel interference and protect the PA from being able to output more power then necessary, thus increasing the device reliability. An objective of the concept is to insure that the clip will not occur most of the time in the process of the level training, while being sure that the peak value of the analog ramp correspond to 3.4 Watt radio output. FIG. 5 shows this situation.

FIG. 5 shows that a margin of, for example, 0.4 dB is maintained between the maximum input voltage to the PA and the voltage at which clip will commence. Corresponding limits for the value of the variable attenuator and the output power are represented by the dotted lines in FIGS. 3 and 4.

To achieve this objective, different approaches are possible.

In accordance with a first preferred embodiment of the invention, a software approach is employed. The slope of the ramp and the duration of the ramp are calibrated once for the lifetime of the radio so that the radio outputs 3.4 Watt. For present purposes, this will be described as occurring in the factory or at the point of sale requiring a power meter, computer and necessary software to perform the calibration and write the ramp slope and time into the look-up table 23, as is straightforward to one skilled in the art. This is achieved by calibrating the ramp's slope or duration to be 0.4 dB below the PA's clipping point, using a default discharge time of the ramp, and by fine tuning the discharge time of the ramp to achieve 3.4 Watt radio output.

Figure 6:
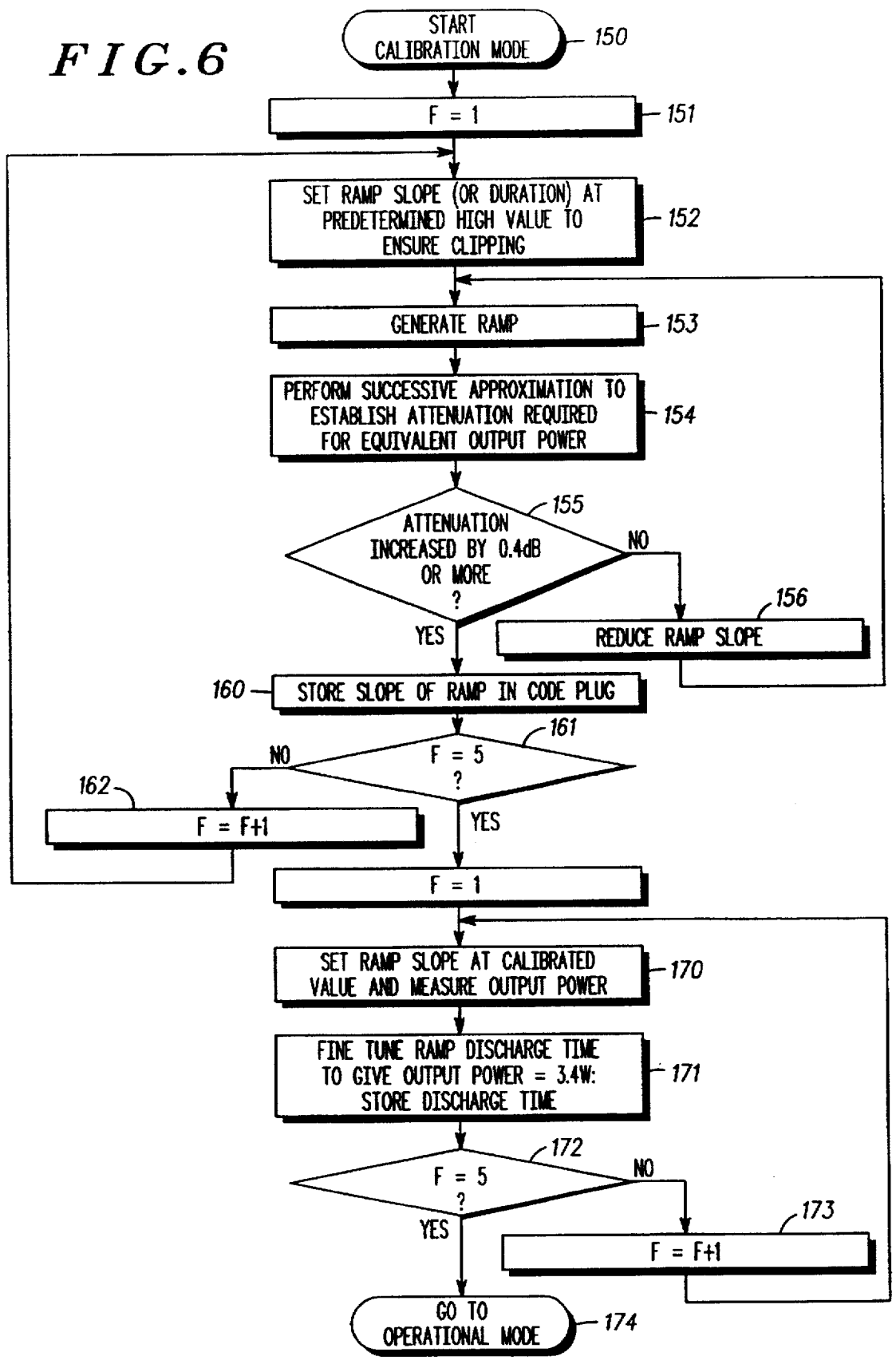
FIGS. 6 and 7 are flow diagrams illustrating operation of the transmitter circuit of FIG. 1 in accordance with a first preferred embodiment of the invention.
Figure 7:
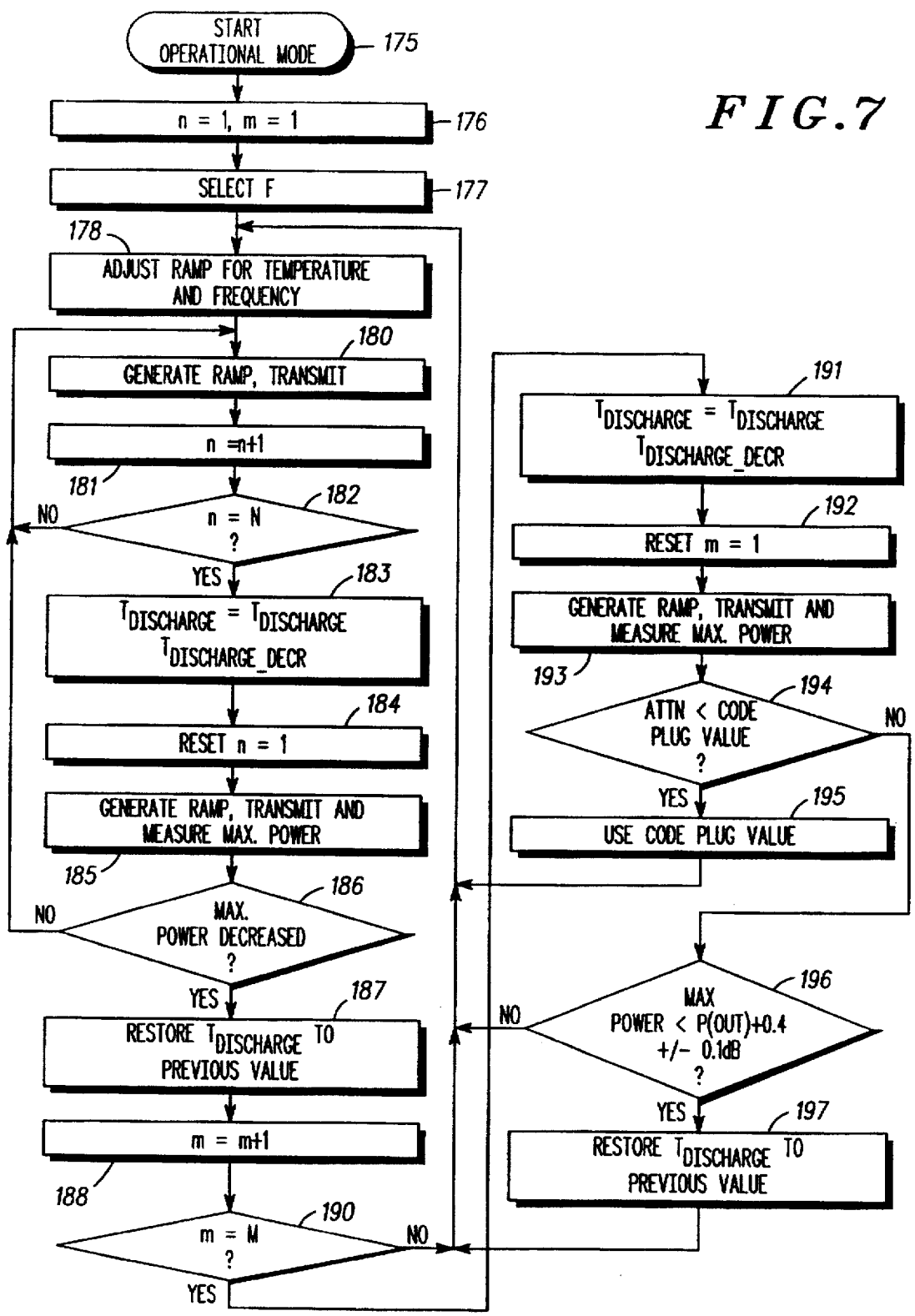

The preferred method is illustrated in FIGS. 6 and 7 and is as follows.

At the factory, the radio is placed in a calibration mode, step 150. A first frequency F is selected (step 151) and the ramp slope is set at some known value, step 152, at which it is absolutely sure that the clip occurs, for example point X in FIGS. 3 and 4. The analog ramp discharge time $T_{discharge}$ is programmed to be 700 microseconds.

The ramp is generated, step 153, and the attenuation of the variable attenuator is read (step 155). The slope of the ramp is gradually reduced, step 156, while monitoring the attenuation of the variable attenuator. (See FIGS. 3 and 4). When the attenuation of the variable attenuator increases by 0.4 dB (point Y in FIG. 3), the slope of the ramp is read and written into the table 23 in the code plug of the radio (step 160). The above procedure will is carried out at five transmit frequencies (steps 161 and 162).

The ramp slope calibration result (from the code plug of the radio) is programmed into the table 23 and the output power is measured (step 170). The discharge time of the analog ramp is changed (step 171) to calibrate the radio to the wanted power (3.4 W).

$$T_{discharge} = T_{ramp\_start} + (700\ \mu sec - T_{ramp\_start})\sqrt{\frac{3.4[watt]}{P_{out}[watt]}} \quad \text{(eqn. 1)}$$

The DSP signal provides a 700±100 µsec "fat portion", so the $T_{discharge}$ will vary as follows:

If $T_{discharge}$>800 µsec, then set $T_{discharge}$ to be 800 µsec.

If $T_{discharge}$<600 µsec, then decrease the ramp slope by one, store it in the code plug and repeat power normalization procedure at all five RF frequencies The algorithm is performed at five RF frequencies (steps 172 and 173) resulting in ten tuning values to be stored in the radio code plug—five values for the ramp slope and five values for $T_{discharge}$.

The purpose of using the ramp discharge time value for power normalization instead of the ramp's slope alone is to minimize variation due to finite resolution. The discharge time approach will make it possible to achieve 0.2 dB accuracy, compared to 0.65 dB that can be achieved by the variation of the ramp slope.

In order to minimize variation vs. temperature, the slope of the ramp is reduced in parallel to power reduction. The slope is reduced by one step per 4 deg. C starting from 53 deg. C (the first reduction will be at 57 deg. C).

During operation in the field, the microprocessor 21 checks whether the radio is still operating below the clip point of the PA. This is advantageous because the clipping point of the PA can change due to temperature variation, DC power supply variation and ageing of the PA.

This is illustrated in FIG. 7 and explained as follows.

An operational mode is entered (step 175). Count values n and m are set to 1 (step 176). A frequency is selected for transmission and the training ramp is adjusted for temperature and frequency. The software uses the Ramp slope value (from the code plug) and adjusts it with temperature. Ramp discharge time is varied according to the tuning values. Linear interpolation is used for other frequencies.

In an appropriate time slot the power amplifier is opened and a training ramp is generated (step 180).

Every N training slots, the $T_{discharge}$ time of the ramp is reduced (steps 181-183), so that the output power will be expected to be reduced by 0.4 dB. The new $T_{discharge}$ is calculated by the following formula:

$$k=0.4 \text{ dB}=10^{(0.4/10)}=1.0965$$

$$T_{discharge\_decr} = T_{ramp\_start} + (T_{discharge} - T_{ramp\_start})\sqrt{\frac{3.4[\text{Watt}]}{P_{out}[\text{Watt}]}} \quad (2a)$$

$$T_{discharge\_decr} = T_{ramp\_start} + (T_{discharge} - T_{ramp\_start})\sqrt{\frac{1}{k}} \quad (2b)$$

The ramp is generated, step 185, in the next assigned training time slot or at the next opportunity and if the output power is [P(out)–0.4 dB]+/–0.1 dB it is assumed that the radio is operating below the clip point(it is checked in step 186 by comparing the variable attenuator before and after the discharge time decrease) and $T_{discharge}$ is restored to its previous value (step 187). If the reduction in the output power is less then the above number, the radio is operating above the clip point and the power must be reduced. The power is reduced by using the new value of $T_{discharge}$ for the next ramp generation (step 180). After the next N training slots the discharge time is shortened again to determine if after another power reduction radio is operating below clip. This is done until the radio is operating below clip.

After M training slots (step 190) the ramp discharge time is increased (step 191) according to:

$$T_{discharge\_incr} = T_{ramp\_start} + \quad (3a)$$

$$(T_{discharge} - T_{ramp\_start})\sqrt{\frac{P_{out}[\text{Watt}] \cdot k}{P_{out}[\text{Watt}]}}$$

$$T_{discharge\_incr} = T_{ramp\_start} + (T_{discharge} - T_{ramp\_start})\sqrt{k} \quad (3b)$$

If the output power is [P(out)+0.4 dB]+/–0.1 dB (step 196), it is assumed that the radio is operating below the clip point and the new discharge time is used as the next ramp discharge time (step 180). If the power is below the above power (step 196), then the radio is operating above the clip point and the discharge time will be left unchanged (step 197).

As a final precautionary feature, the variable attenuator value that was set during the training is compared with the value of the variable attenuator in non-volatile memory (the code plug) of the radio. (The value of the variable attenuator in the code plug of the radio is set during power tuning in the factory and corresponds to, for example, 3.4 Watt radio output power.) The microprocessor 21 selects the larger of the two attenuator values and uses it for "no-training" slots. Thus, in every case of a discharge time increase (step 193), the variable attenuator value received during training is compared with the value in the radio code plug (step 194). In each case the value of the variable attenuator will be no less then the value of the code plug (step 195).

Modifications in the above approach can be made. For example, steps 188, 190 and 192 can be omitted, so that a successful test in step 186 always initiates steps 191 to 197. The ramp increase in step 191 is preferably performed less frequently (or not at all, or selectively, depending on previous ramp decreases), because step 193 may cause interference in adjacent channels.

Figure 8:
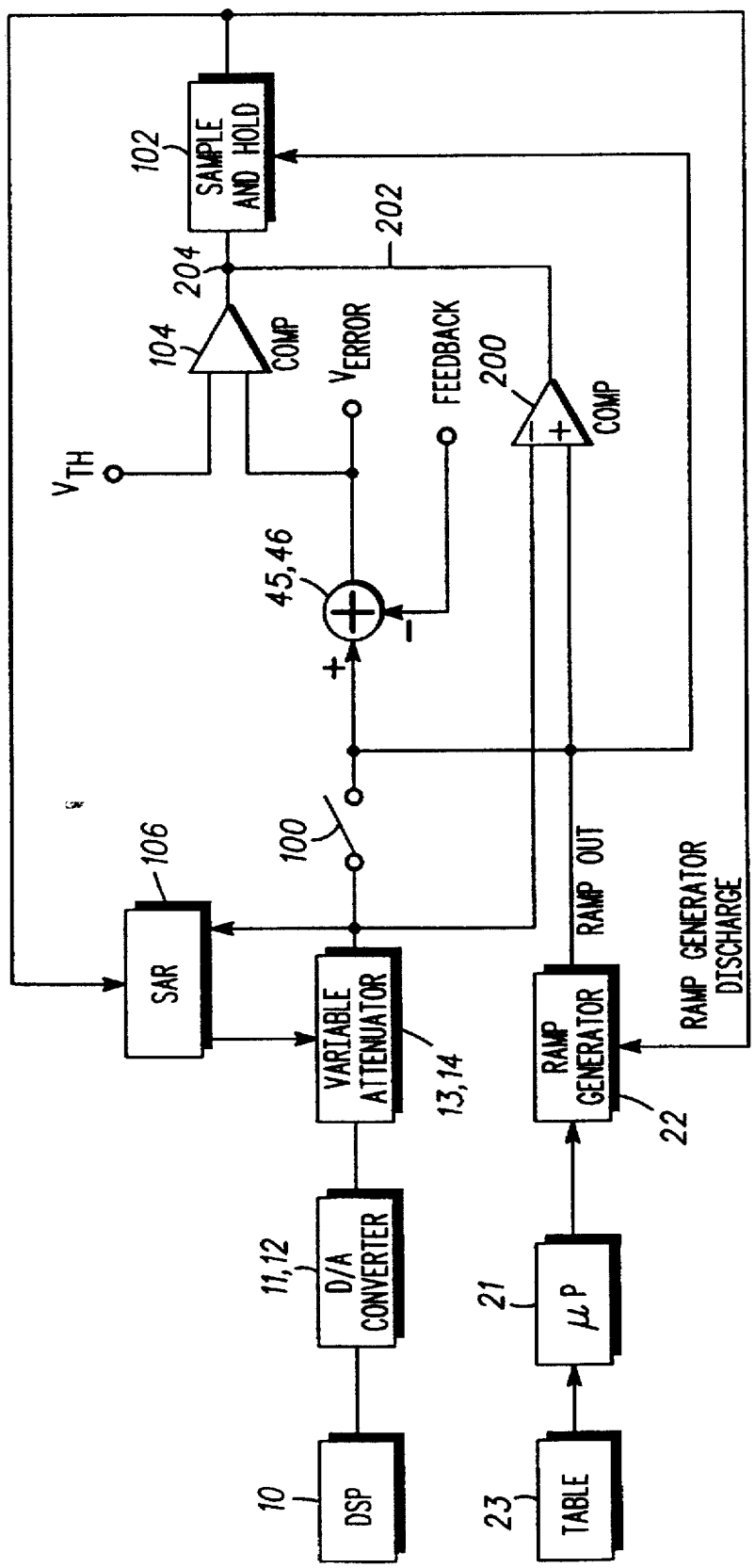
FIG. 8 is a diagram of an improved radio transmitter circuit in accordance with a second preferred embodiment of the invention.

An alternative approach is a hardware implementation, for which an example is given in FIG. 8. This figure shows that an additional comparator 200 is provided having a first input connected to the output of the variable attenuators 13 and 14 and a second input connected to the output of the ramp generator 22. Thus comparator 200 compares the output of the analog ramp generator 22 with the DSP signal after attenuation. The output of the comparator 200 outputs an activating signal 202 to the S/H 102. This signal is applied to a wired OR junction 204 together with the output signal of the comparator 104. The variable attenuators 13 & 14 are set to a value, so that in a flat region of the DSP training signal the radio output power will be 3.4 Watt.

The analog ramp discharge is started if one of the following events happens: (a) clip occurs or (b) the analog ramp becomes equal to or higher than the flat portion of the DSP signal. This will ensure that the clip will not occur while the output power of the radio is set to 3.4 Watt.

The hardware approach has several advantages over the software approach: there is no need for ramp slope and discharge time tuning; there is no need for special software and there is a space in the code plug of the radio (EEPROM).

There are at least two major advantages with the arrangements described: there is no clipping of the PA during operation, thus causing less interference in adjacent channels and the PA is not driven into high output power and damage to the PA is reduced. In this way, the reliability of the PA is increased.

We claim:

1. A method of calibrating a power amplifier for a radio transmitter, comprising the steps of:
   entering a calibration mode of operation;
   providing an increasing input signal to the amplifier until the amplifier commences clipping;
   reducing the maximum input level of said input signal and identifying a value for said input which does not cause clipping;
   entering an operational mode;
   periodically providing an increasing input signal to the amplifier up to said value and determining whether clipping occurs.

2. A method according to claim 1, wherein the step of determining comprises periodically decreasing the maximum level of the increasing input signal, measuring an output from the amplifier and checking whether a corresponding decrease in the maximum level of the output signal results.

3. A method according to claim 1 or 2, wherein the step of determining comprises periodically increasing the maximum level of the increasing input signal, measuring an output from the amplifier and checking whether a corresponding increase in the maximum level of the output signal results.

4. A method according to claim 1, wherein the step of determining comprises periodically decreasing the maximum level of the increasing input signal, measuring an output from the amplifier and checking whether a corresponding decrease in the maximum level of the output signal results and periodically increasing the maximum level of the increasing input signal, measuring an output from the amplifier and checking whether a corresponding increase in the maximum level of the output signal results, wherein the step of periodically decreasing is carried out more frequently than the step of periodically increasing.

5. A method according to any one of the preceding claims, comprising the step of determining that clipping has occurred and decreasing said value for the maximum input level during a plurality of subsequent steps of providing said increasing input signal.

6. A method according to any one of the preceding claims, wherein the step of providing an increasing input signal comprises generating a ramp signal having a controlled slope and a controlled duration.

7. A method according to claim 6, wherein the step of reducing the maximum input level comprises coarse adjustment of the maximum level of the ramp signal by controlling the rate of increase of the ramp signal and fine adjustment of the maximum level by controlling the duration of the ramp signal.

8. A method according to claim 6, comprising the step of measuring a temperature value of the amplifier and reducing the rate of increase of the ramp signal as a function of increasing temperature.

9. A radio transmitter comprising a power amplifier (36) having an input and an output, controlled input signal generating means (22) for supplying a signal to the input, output monitoring means (104) for determining when the amplifier commences clipping, memory means (23) for storing a maximum input signal value and control means (21) arranged to provide an input signal to the amplifier, wherein the control means are arranged to store in said memory means a maximum input signal value and to control the input signal generating means to generate periodically an increasing input signal up to a value not exceeding said stored value, where the stored value represents an input signal value below a value at which clipping will commence.

10. A radio according to claim 9, further comprising input means (10) arranged to supply to the amplifier a signal at a maximum input value and comparator means (200) for comparing said maximum input value signal with a signal from said controlled input signal generating means and for providing a signal to said control means when said signal from said controlled input signal generating means exceeds said maximum input value signal.

* * * * *